(12) United States Patent
Park et al.

(10) Patent No.: US 11,302,526 B2
(45) Date of Patent: Apr. 12, 2022

(54) SUPERCRITICAL DRYING APPARATUS AND METHOD OF DRYING SUBSTRATE USING THE SAME

(71) Applicant: SAMSUNG ELECTRONICS CO., LTD., Suwon-si (KR)

(72) Inventors: Sangjine Park, Suwon-si (KR); Byung-Kwon Cho, Suwon-si (KR); Jihoon Jeong, Seongnam-si (KR); Youngtak Kim, Hwaseong-si (KR); Yongsun Ko, Suwon-si (KR); Seulgee Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/561,078

(22) Filed: Sep. 5, 2019

(65) Prior Publication Data

US 2020/0227253 A1 Jul. 16, 2020

(30) Foreign Application Priority Data

Jan. 14, 2019 (KR) .................. 10-2019-0004858

(51) Int. Cl.
*H01L 21/02* (2006.01)
*H01L 21/67* (2006.01)

(52) U.S. Cl.
CPC .. *H01L 21/02101* (2013.01); *H01L 21/67034* (2013.01)

(58) Field of Classification Search
CPC ......... H01L 21/02101; H01L 21/67098; H01L 21/67103; H01L 21/67034; H01L 21/67028; H01L 21/67115; H01L 21/02098; H01L 21/02345; H01L 21/02354; H01L 21/423; H01L 21/428; H01L 21/263; H01L 21/268; H01L 21/02041–02101; H01L 21/02052; H01L 21/02054; H01L 21/67017–6704; H01L 21/67051; B08B 7/0042; B08B 7/0035; B08B 7/005; B08B 7/0057; F26B 3/28; H05B 3/0033; H05B 3/0047
See application file for complete search history.

(56) References Cited

U.S. PATENT DOCUMENTS 5,210,959 A * 5/1993 Brestovansky ..... C23C 16/4401
34/210
5,350,480 A * 9/1994 Gray ................. H01L 21/02071
134/31

(Continued)

FOREIGN PATENT DOCUMENTS

JP 2016-107272 A 6/2016
JP 2016-115893 A 6/2016

(Continued)

*Primary Examiner* — Mikhail Kornakov
*Assistant Examiner* — Richard Z. Zhang
(74) *Attorney, Agent, or Firm* — Lee IP Law, P.C.

(57) ABSTRACT

A supercritical drying apparatus and a method of drying a substrate, the apparatus including a drying chamber configured to receive a supercritical fluid and to dry a substrate; a chuck in the drying chamber, the chuck being configured to receive the substrate; and a particle remover in the drying chamber, the particle remover being configured to remove dry particles from the substrate by heating the substrate with radiant heat.

17 Claims, 5 Drawing Sheets

(56) References Cited

U.S. PATENT DOCUMENTS

| | | | |
|---|---|---|---|
| 6,220,607 B1* | 4/2001 | Schneider | H01L 21/67103 |
| | | | 277/650 |
| 7,913,702 B2* | 3/2011 | Moriya | H01L 21/02101 |
| | | | 134/94.1 |
| 8,465,596 B2 | 6/2013 | Toshima et al. | |
| 8,889,563 B2 | 11/2014 | Lim | |
| 9,738,977 B1* | 8/2017 | Karim | C23C 16/4408 |
| 9,922,848 B2 | 3/2018 | Miya et al. | |
| 2007/0277930 A1* | 12/2007 | Yokoyama | H01L 21/67207 |
| | | | 156/345.31 |
| 2009/0029046 A1* | 1/2009 | Kudoh | H01L 21/67017 |
| | | | 427/248.1 |
| 2014/0231671 A1* | 8/2014 | Lu | H01L 21/67115 |
| | | | 250/455.11 |
| 2014/0235068 A1* | 8/2014 | Ashihara | H01L 21/02164 |
| | | | 438/771 |
| 2016/0121374 A1* | 5/2016 | Lee | H01L 21/67028 |
| | | | 134/182 |
| 2016/0372317 A1 | 12/2016 | Lee et al. | |
| 2017/0008040 A1* | 1/2017 | Jeong | H01L 21/67017 |
| 2018/0164689 A1* | 6/2018 | Sano | H01L 21/31058 |
| 2018/0254224 A1* | 9/2018 | Kitazawa | H01L 21/67288 |
| 2019/0355574 A1* | 11/2019 | Kanno | H01L 21/67028 |

FOREIGN PATENT DOCUMENTS

| | | | |
|---|---|---|---|
| KR | 20120056620 A | * | 6/2012 |
| KR | 10-1187375 B1 | | 10/2012 |
| KR | 10-2014-0014043 A | | 2/2014 |
| KR | 10-1395251 B1 | | 5/2014 |
| KR | 10-1500705 B1 | | 3/2015 |
| KR | 10-2015-0138975 A | | 12/2015 |
| KR | 20150138975 A | * | 12/2015 |
| KR | 10-1621485 B1 | | 5/2016 |
| KR | 20170056224 A | * | 5/2017 |
| KR | 10-2017-0137245 A | | 12/2017 |

* cited by examiner

SUPERCRITICAL DRYING APPARATUS AND METHOD OF DRYING SUBSTRATE USING THE SAME

CROSS-REFERENCE TO RELATED APPLICATION

Korean Patent Application No. 10-2019-0004858, filed on Jan. 14, 2019, in the Korean Intellectual Property Office, and entitled: "Supercritical Drying Apparatus and Method of Drying Substrate Using the Same," is incorporated by reference herein in its entirety.

BACKGROUND

1. Field

Embodiments relate to a supercritical drying apparatus for drying a substrate and a method of drying a substrate using the same.

2. Description of the Related Art

Recently, design rules of semiconductor devices have been rapidly reduced. Thus, methods of manufacturing semiconductor devices have been variously developed.

SUMMARY

The embodiments may be realized by providing a supercritical drying apparatus including a drying chamber configured to receive a supercritical fluid and to dry a substrate; a chuck in the drying chamber, the chuck being configured to receive the substrate; and a particle remover in the drying chamber, the particle remover being configured to remove dry particles from the substrate by heating the substrate with radiant heat.

The embodiments may be realized by providing a supercritical drying apparatus including a lower housing having a fluid outlet; an upper housing on the lower housing and having a fluid inlet; a chuck on a bottom surface of the upper housing, the chuck being configured to receive a substrate; a fluid supply configured to provide a supercritical fluid onto the substrate through the fluid inlet; and a light source in the upper housing between the chuck and the fluid inlet when viewed in a plan view, the light source being configured to decompose dry particles on the substrate by heating the substrate.

The embodiments may be realized by providing a method of drying a substrate, the method including providing a substrate into a drying chamber that includes a lower housing and an upper housing on the lower housing; providing a supercritical fluid into the drying chamber, thereby drying the substrate; providing radiant heat to the substrate to instantaneously heat the substrate; and separating the upper housing from the lower housing.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
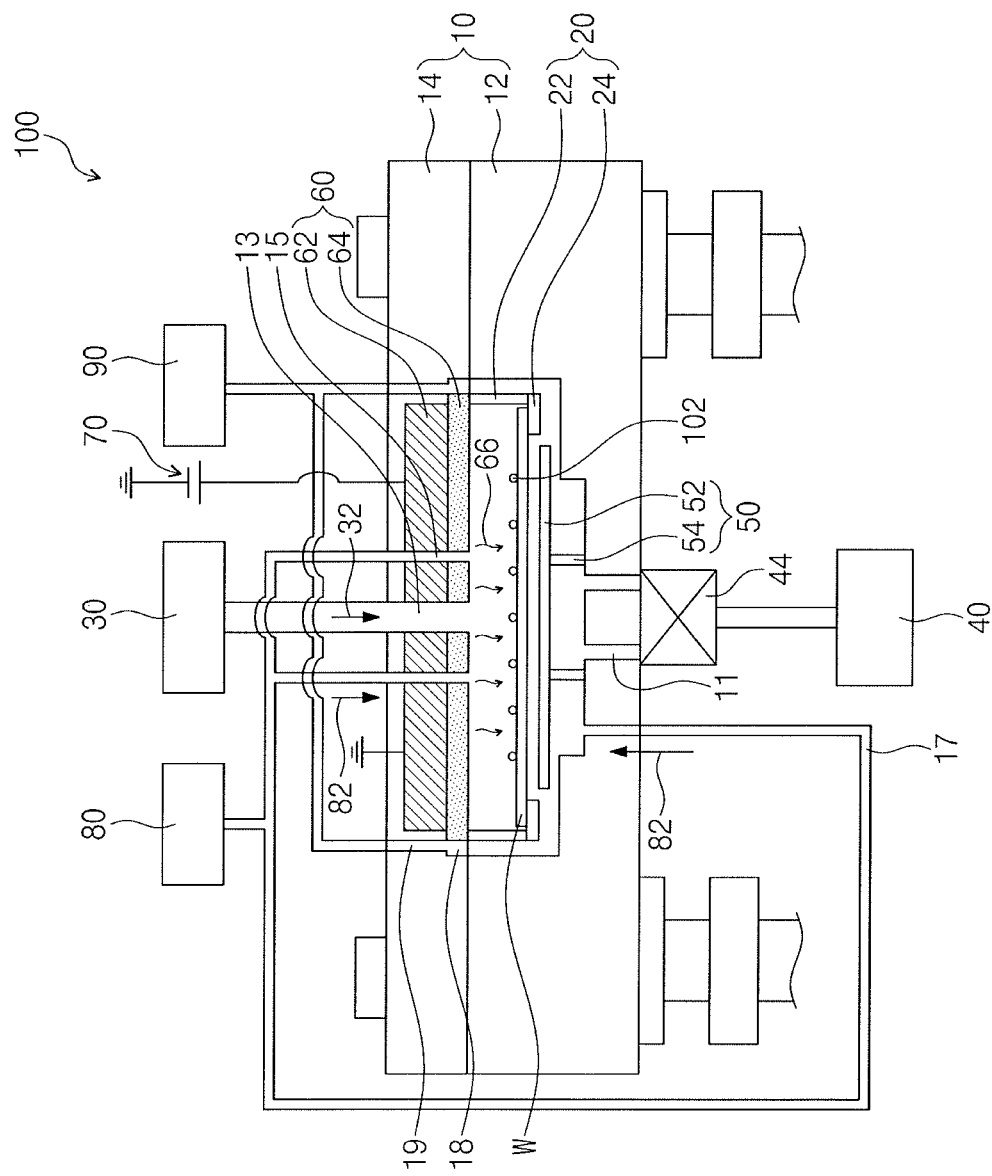
FIGS. 1 and 2 illustrate views of a supercritical drying apparatus according to some embodiments.
Figure 2:
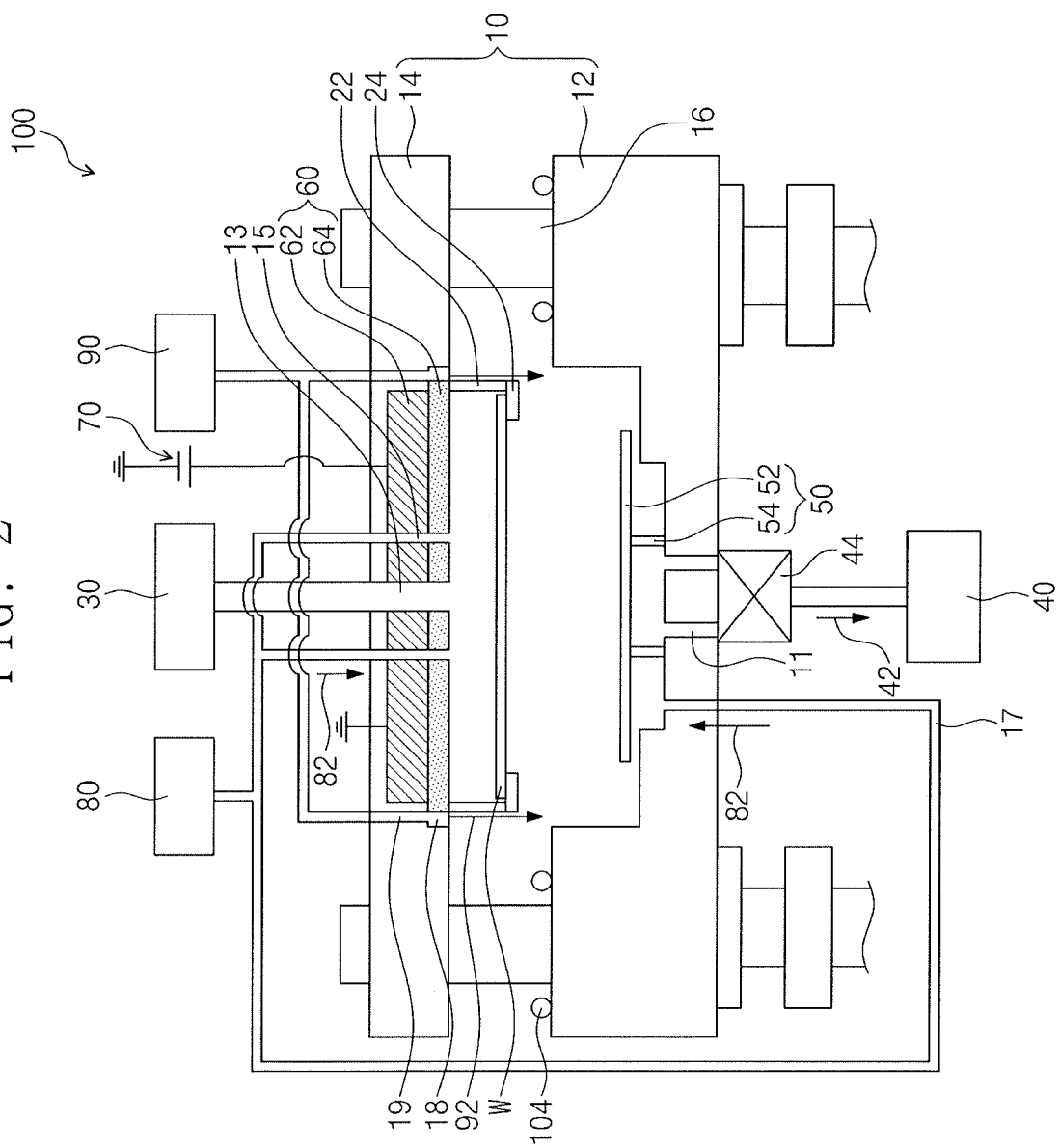

FIGS. 1 and 2 illustrate a drying apparatus 100 according to some embodiments.

Referring to FIG. 1, a drying apparatus 100 according to some embodiments may include a supercritical drying apparatus. In an implementation, the drying apparatus 100 may include, e.g., a drying chamber 10, a chuck 20, a fluid supply 30, an exhaust 40, a fluid blocker 50, a particle remover 60, a power source 70, a first gas supply 80, and a second gas supply 90.

The drying chamber 10 may receive a supercritical fluid 32. The supercritical fluid 32 may dry a substrate W. For example, the supercritical fluid 32 may include supercritical carbon dioxide. The supercritical fluid 32 may remove isopropyl alcohol on or from the substrate W. A pressure of the supercritical fluid 32 in the drying chamber 10 may be a pressure (e.g., 10 atmospheres to 200 atmospheres) higher than a normal or ambient pressure (e.g., 1 atmosphere or 760 Torr). In an implementation, the drying chamber 10 may include a lower housing 12 and an upper housing 14.

The lower housing 12 may be under the upper housing 14. The lower housing 12 may have a fluid outlet 11 and a lower gas inlet 17. The supercritical fluid 32 may be exhausted to the exhaust 40 through the fluid outlet 11.

The upper housing 14 may be on the lower housing 12. The upper housing 14 may have a fluid inlet 13, an inner gas inlet 15, and an outer gas inlet 19.

The fluid inlet 13 may be at a center of the upper housing 14. The supercritical fluid 32 may flow into the drying chamber 10 through the fluid inlet 13.

The inner gas inlet 15 may be between the fluid inlet 13 and the outer gas inlet 19. A first gas 82 may be provided onto the substrate W in the drying chamber 10 through the inner gas inlet 15. The first gas 82 may remove dry particles 102 on or from the substrate W. The dry particles 102 may be defect particles remaining on the substrate W. In an implementation, the dry particles 102 may include particles (e.g., $CO_2 + 2CH_8O$) of isopropyl alcohol mixed with carbon dioxide, or hydrogenated carbon particles (e.g., $CH$, $CH_2$, $CH_3$, and/or $CH_4$).

Figure 3:
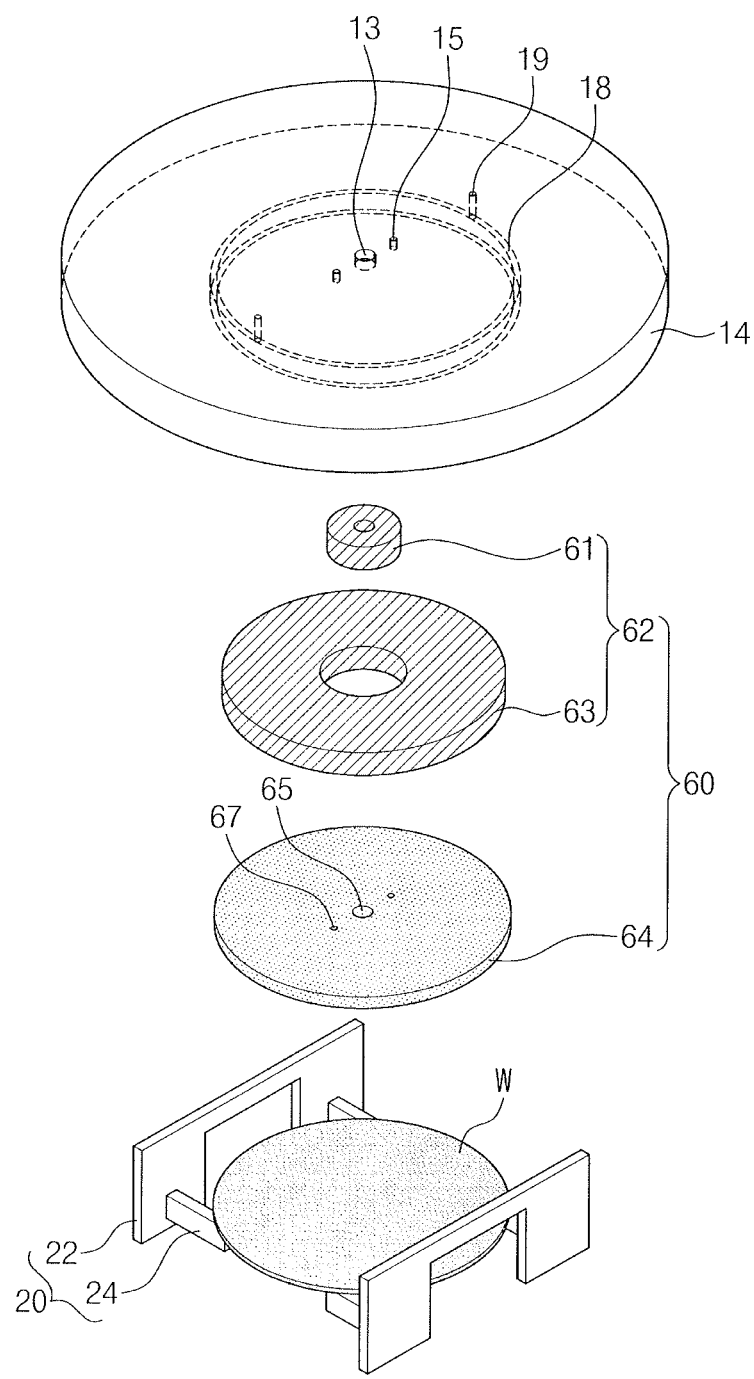
FIG. 3 illustrates a perspective view of an upper housing, a chuck, and a particle remover of FIG. 1.

FIG. 3 illustrates the upper housing 14, the chuck 20, and the particle remover 60 of FIG. 1.

Referring to FIGS. 1 to 3, the outer gas inlet 19 may be outside the chuck 20. A groove 18 may be under the outer gas inlet 19. The groove 18 may be connected to the outer gas inlet 19. The groove 18 may have a ring shape. A diameter of the groove 18 may be greater than a diameter of the substrate W. A second gas 92 may be provided into the drying chamber 10 through the outer gas inlet 19 and the groove 18. The second gas 92 may be provided around the substrate W along the groove 18. The second gas 92 may form an air curtain along an outer circumferential surface of the substrate W to help block an inflow of abrasion particles 104 of the lower housing 12 and the upper housing 14 toward the substrate W. The abrasion particles 104 may be defect particles remaining on a top surface of a side wall of the lower housing 12.

Referring to FIG. 2, an elevator 16 may be provided at edges of the lower housing 12 and the upper housing 14. The elevator 16 may be configured to move the upper housing 14 with respect to the lower housing 12 such that the lower housing 12 and the upper housing 14 may be coupled to each other (e.g., in contact or otherwise directly adjacent to each other) or may be separated from each other. When the lower housing 12 and the upper housing 14 are coupled to or separated from each other, the abrasion particles 104 could be generated by friction of the top surface of the side wall of the lower housing 12 and a bottom surface of the upper housing 14. In an implementation, the abrasion particles 104 may be formed of a metal component (e.g., Al or an Al alloy).

The removal of the dry particles 102 and the blocking of the abrasion particles 104 will be described below in detail.

Referring to FIGS. 1 to 3, the chuck 20 may be on a bottom surface of the upper housing 14. The chuck 20 may have a two-piece structure, and the two pieces may face each other and may receive the substrate W. In an implementation, each piece of the chuck 20 facing each other may include a fixing plate 22 and a holder 24. The fixing plate 22 may be on the bottom surface of the upper housing 14 between the inner gas inlet 15 and the outer gas inlet 19. The holder 24 may be connected to an end of the fixing plate 22, which is opposite to the bottom surface of the upper housing 14. The holder 24 may support the substrate W.

The fluid supply 30 may be connected to the fluid inlet 13. The fluid supply 30 may provide the supercritical fluid 32 onto the substrate W in the drying chamber 10. The supercritical fluid 32 may be provided in a direction from a center toward an edge of the substrate W.

The exhaust 40 may be connected to the fluid outlet 11 of the lower housing 12. The exhaust 40 may have an exhaust valve 44. The exhaust valve 44 may control exhaust of the supercritical fluid 32, the first gas 82, and the second gas 92. The exhaust 40 may exhaust the supercritical fluid 32, the first gas 82, and the second gas 92 from the drying chamber 10.

The fluid blocker 50 may be in the lower housing 12. The fluid blocker 50 may be on the fluid outlet 11. The fluid blocker 50 may move the supercritical fluid 32 in the direction toward the edge of the substrate W. In an implementation, the fluid blocker 50 may help prevent the substrate W from being separated from the chuck 20 by a back flow of the supercritical fluid 32 in the exhaust 40. In an implementation, the fluid blocker 50 may include a blocking plate 52 and a supporter 54. The blocking plate 52 may be on the fluid outlet 11. The blocking plate 52 may disperse an exhaust pressure of the supercritical fluid 32 in the fluid outlet 11 along the outer circumferential surface of the substrate W in the drying chamber 10. For example, the supercritical fluid 32 in the drying chamber 10 may mainly move from the edge of the substrate W to an edge of the blocking plate 52. The supporter 54 may separate and/or support the blocking plate 52 from an inner bottom of the lower housing 12 by a certain distance or more.

The particle remover 60 may be in the upper housing 14. The particle remover 60 may remove the dry particles 102 from the substrate W. For example, the particle remover 60 may heat the substrate W by radiant heat 66 to remove the dry particles 102. The radiant heat 66 may be provided by, e.g., ultraviolet light, visible light, infrared light, laser light, or the like. In an implementation, when the dry particles 102 are the particles (e.g., $CO_2+2CH_8O$) of isopropyl alcohol mixed with carbon dioxide, the radiant heat 66 may decompose the dry particle 102 into carbon dioxide ($CO_2$) gas, carbon monoxide (e.g., $2CO$), and/or methane ($4CH_4$). In an implementation, the dry particles 102 may be sublimated by the radiant heat 66. In an implementation, when the dry particles 102 are the hydrogenated carbon particles (e.g., $CH$, $CH_2$, $CH_3$, $CH_4$), the radiant heat 66 may sublimate the dry particles 102 into a hydrogenated carbon gas. In an implementation, the particle remover 60 may include a light source 62 and a window 64. In an implementation, the light source 62 may include, e.g., a light emitting diode (LED), a flash lamp, a laser device, or the like. In an implementation, the light source 62 may include, e.g., an inner light source 61 and an outer light source 63. Each of the inner light source 61 and the outer light source 63 may have a ring shape. The inner light source 61 may be in the outer light source 63 (e.g., the inner light source 61 may be surrounded by the outer light source 63). The inner light source 61 may be between the fluid inlet 13 and the inner gas inlet 15. The outer light source 63 may be between the inner gas inlet 15 and the outer gas inlet 19. In an implementation, a gap may be provided between the inner light source 61 and the outer light source 63. The first gas 82 may be provided into the drying chamber 10 through the gap.

The window 64 may cover the inner light source 61 and the outer light source 63 in the upper housing 14. The window 64 may transmit the radiant heat 66 to the substrate W. The window 64 may protect the inner light source 61 and the outer light source 63 from the supercritical fluid 32, the first gas 82, and the decomposed gases of the dry particles 102. The window 64 may have a first hole 65 and a second hole 67. The first hole 65 may be aligned with the fluid inlet 13. The supercritical fluid 32 may be provided into the drying chamber 10 through the fluid inlet 13 and the first hole 65. The second hole 67 may be aligned with the inner gas inlet 15. The first gas 82 may be provided into the drying chamber 10 through the inner gas inlet 15 and the second hole 67.

The power source 70 may be configured to supply power to the inner light source 61 and the outer light source 63 of the particle remover 60. For example, the power source 70 may provide DC power or AC power to the inner light source 61 and the outer light source 63.

The first gas supply 80 may be connected to the inner gas inlet 15 of the upper housing 14. The first gas supply 80 may supply the first gas 82 onto the substrate W. The first gas 82 may be provided from the center to the edge of the substrate W and then may be exhausted through the exhaust 40. The first gas 82 may help remove the dry particles 102 from the substrate Was well as the decomposed gases of the dry particles 102. The first gas 82 may be provided into the drying chamber 10 at a normal pressure (e.g., 1 atmosphere or 1 bar) or a pressure higher than an ambient pressure. The first gas 82 may be supplied at a temperature that is higher than a ambient temperature. When the lower housing 12 and the upper housing 14 are separated from each other, the first gas 82 may blow the abrasion particles 104 out of the lower housing 12 and the upper housing 14. In an implementation, the first gas 82 may include, e.g., nitrogen ($N_2$) gas or argon (Ar) gas.

The second gas supply 90 may be connected to the outer gas inlet 19. The second gas supply 90 may provide the second gas 92 at an outer side of the substrate W and the chuck 20. The second gas 92 may be provided around the substrate W through the groove 18 to help block inflow of the abrasion particles 104 toward the substrate W. The second gas 92 may be provided into the drying chamber 10 at a normal pressure or a pressure higher than an ambient pressure. When the lower housing 12 and the upper housing 14 are separated from each other, the second gas 92 may blow the abrasion particles 104 out of the lower housing 12 and the upper housing 14. In an implementation, the second gas 92 may include the same gas as the first gas 82. In an implementation, the second gas 92 may include nitrogen ($N_2$) gas or argon (Ar) gas.

A method of drying a substrate using the drying apparatus 100 according to the aforementioned embodiments will be described hereinafter.

Figure 4:
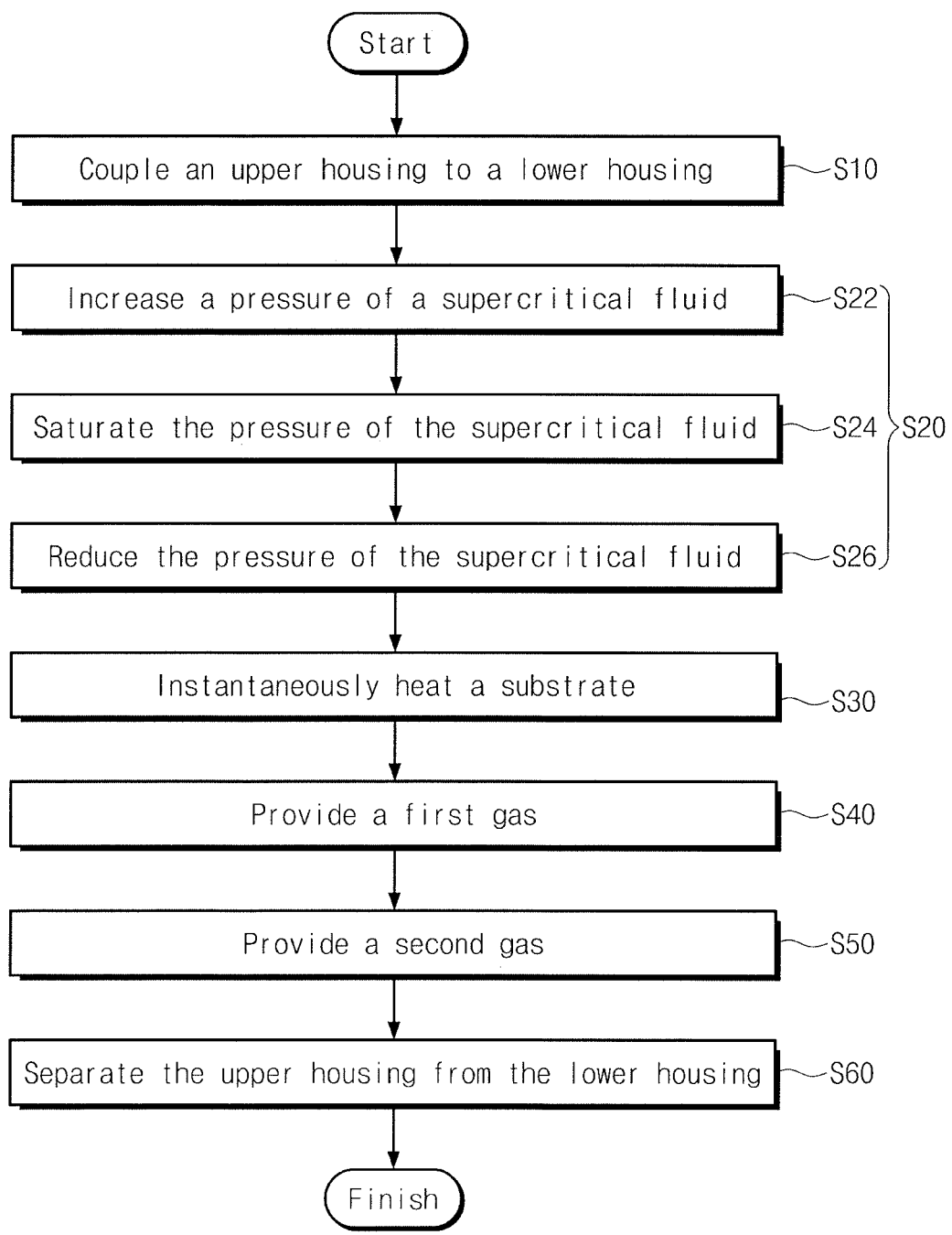
FIG. 4 illustrates a flowchart of a method of drying a substrate, according to some embodiments.

FIG. 4 illustrates a flowchart of a method of drying a substrate, according to some embodiments.

Referring to FIG. 4, a method of drying a substrate according to some embodiments may include coupling the upper housing 14 to the lower housing 12 (S10), providing the supercritical fluid 32 (S20), instantaneously heating the substrate W (S30), providing the first gas 82 (S40), providing the second gas 92 (S50), and separating the upper housing 14 from the lower housing 12 (S60).

When the substrate W is provided on the chuck 20, the elevator 16 may lower the upper housing 14 to couple the upper housing 14 to the lower housing 12 (S10). The substrate W may have isopropyl alcohol thereon. The isopropyl alcohol may be between patterns of the substrate W.

Thereafter, the fluid supply 30 may provide the supercritical fluid 32 into the drying chamber 10 (S20). In an implementation, providing S20 the supercritical fluid 32 may include increasing a pressure of the supercritical fluid 32 (S22), saturating the pressure of the supercritical fluid 32 (S24), and then reducing the pressure of the supercritical fluid 32 (S26).

Figure 5:
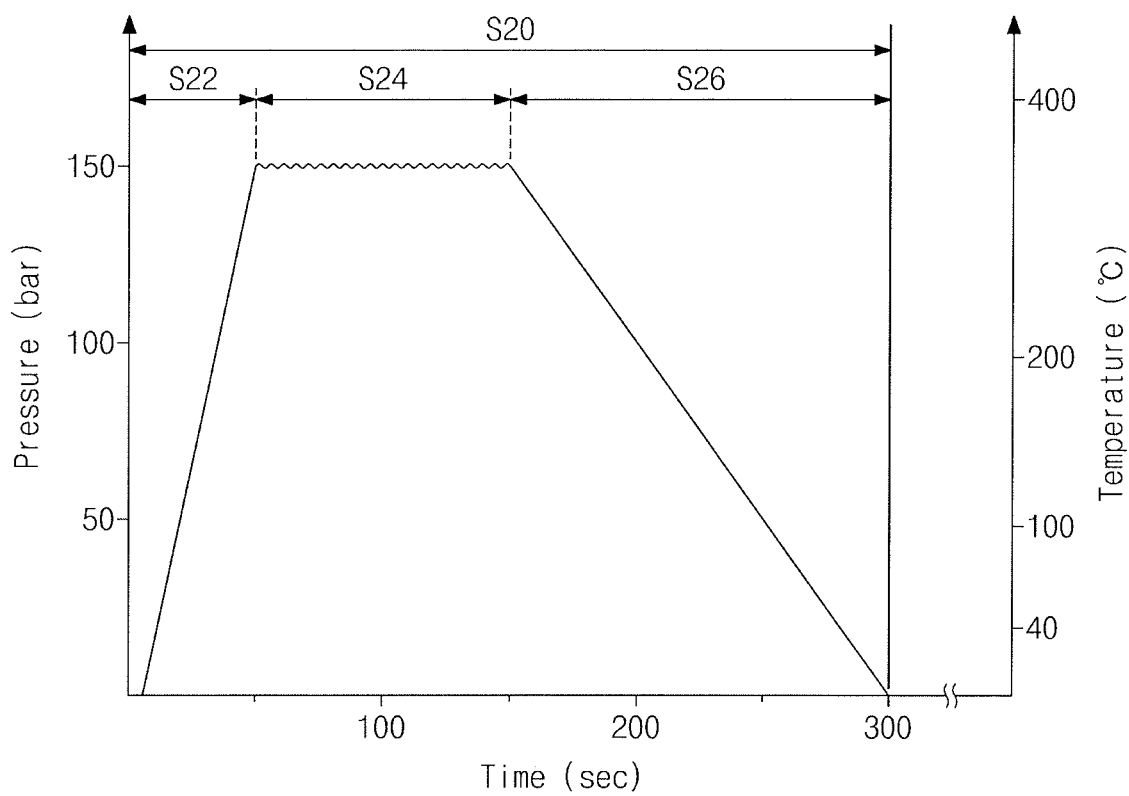
FIG. 5 illustrates a graph showing changes in pressure and temperature of a supercritical fluid in a drying chamber of FIG. 1.

FIG. 5 illustrates a graph showing changes in pressure and temperature of the supercritical fluid 32 in the drying chamber 10 of FIG. 1.

Referring to FIGS. 4 and 5, the fluid supply 30 may provide the supercritical fluid 32 onto the substrate W to increase the pressure of the supercritical fluid 32 in the drying chamber 10 (S22). The supercritical fluid 32 may be provided for about 50 seconds, and the pressure of the supercritical fluid 32 may be gradually increased to about 150 bars. A temperature of the supercritical fluid 32 may increase to about 200 degrees Celsius.

Next, the fluid supply 30 may stop the supply of the supercritical fluid 32 to saturate the pressure of the supercritical fluid 32 in the drying chamber 10 (S24). For example, the pressure of the supercritical fluid 32 may be saturated at about 150 bars for about 100 seconds. The supercritical fluid 32 may be substituted for the isopropyl alcohol on the substrate W. For example, the supercritical fluid 32 may be provided between the patterns of the substrate W to remove the isopropyl alcohol from the substrate W.

Subsequently, the exhaust 40 may exhaust the supercritical fluid 32 in the drying chamber 10 to reduce the pressure of the supercritical fluid 32 (S26). The pressure of the supercritical fluid 32 may be gradually decreased to a normal pressure (e.g., about 1 bar) for about 150 seconds. The supercritical fluid 32 may be a fluid having a surface tension of 0 (zero). The supercritical fluid 32 may be evaporated at a pressure of about 72 bars or less. The evaporated supercritical fluid 32 may be a carbon dioxide gas. When the pressure of the supercritical fluid 32 is lower than about 72 bars, the supercritical fluid 32 may be evaporated and the substrate W may be dried. The supercritical fluid 32 may be removed or dried without collapse of the patterns of the substrate W. The supercritical fluid 32 and a portion of the isopropyl alcohol may result in dry particles 102 remaining on the substrate W.

Subsequently, the power source 70 may temporarily supply power to the particle remover 60 to instantaneously or quickly heat the substrate W (S30). The particle remover 60 may remove the dry particles 102 from the substrate W by using the radiant heat 66. The dry particles 102 may be decomposed or sublimated by the radiant heat 66. When the radiant heat 66 is provided onto the substrate W, the pressure and the temperature of the supercritical fluid 32 may be instantaneously or quickly increased and then reduced.

Next, the first gas supply 80 may supply the first gas 82 (S40). The first gas 82 may be provided onto the substrate W. The first gas 82 may be provided for about 10 seconds at a normal pressure or a pressure higher than an ambient pressure. The first gas 82 may remove the dry particles 102 from the substrate W and the decomposed gases of the dry particles 102.

Subsequently, the second gas supply 90 may supply the second gas 92 into the drying chamber 10 (S50). The second gas 92 may be provided for about 10 seconds at a normal pressure or a pressure higher than an ambient pressure. The second gas 92 may form an air curtain around the substrate W and the chuck 20. The second gas 92 may block an inflow of the abrasion particles 104 and/or the dry particles 102 toward the substrate W.

Subsequently, the elevator 16 may lift the upper housing 14 to separate the upper housing 14 from the lower housing 12 (S60). The abrasion particles 104 may be generated on a top surface of a side wall of the lower housing 12. The first gas 82 and the second gas 92 may increase the pressure in the drying chamber 10 to a pressure higher than ambient pressure, and thus they may blow the abrasion particles 104 out of the lower housing 12 and the upper housing 14. When the abrasion particles 104 are between the lower housing 12 and the upper housing 14, the second gas 92 may block an inflow of the abrasion particles 104 toward the substrate W.

Thereafter, a robot arm may unload the substrate W from the chucks 20.

By way of summation and review, a cleaning solution of a wet cleaning process could collapse patterns or adhere between patterns by surface tension in a drying process. A supercritical drying process may replace the cleaning solution on the substrate with a supercritical fluid, thereby preventing patterns from collapsing or being joined to each other.

In the supercritical drying apparatus and the method of drying a substrate using the same according to the embodiments, the substrate may be heated by the radiant heat to remove the dry particles generated on the substrate by the supercritical fluid.

One or more embodiments may provide a supercritical drying apparatus capable of removing dry particles formed in drying a substrate.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device.

The plurality of device structures may be arranged in an array and/or in a two-dimensional pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A supercritical drying apparatus, comprising:
   a drying chamber configured to receive a supercritical fluid and to dry a substrate;
   a chuck in the drying chamber, the chuck being configured to receive the substrate; and
   a particle remover in the drying chamber, the particle remover being configured to remove dry particles from the substrate by heating the substrate with radiant heat, wherein:
   the drying chamber includes:
      a lower housing having a fluid outlet, and
      an upper housing on the lower housing and having a fluid inlet, a plurality of inner gas inlets on opposite sides of the fluid inlet, a plurality of outer gas inlets on opposite sides of the inner gas inlets, and a groove under the plurality of outer gas inlets,
   the particle remover includes a light source on an inner surface of the upper housing and a window plate under the light source, the light source including an outer light source and an inner light source in the outer light source,
   the inner light source is disposed between the fluid inlet and the plurality of inner gas inlets,
   the plurality of inner gas inlets are disposed between an outer sidewall of the inner light source and an inner sidewall of the outer light source,
   the outer light source is disposed between the plurality of inner gas inlets and the plurality of outer gas inlets,
   the chuck includes a pair of fixing plates connected to the window plate and a plurality of holders connected to the pair of fixing plates, wherein the pair of fixing plates face each other, and
   the groove has a ring shape, which surrounds the window plate, and an inner diameter of the groove is equal to a distance between outer sidewalls of the pair of fixing plates.

2. The supercritical drying apparatus as claimed in claim 1, wherein the window plate covers the light source.

3. The supercritical drying apparatus as claimed in claim 2, wherein the light source includes a light emitting diode, a flash lamp, or a laser device.

4. The supercritical drying apparatus as claimed in claim 2, further comprising a power source configured to provide power to the light source.

5. The supercritical drying apparatus as claimed in claim 1, wherein:
   the outer light source is between the plurality of inner gas inlets and the chuck when viewed in a plan view.

6. The supercritical drying apparatus as claimed in claim 5, further comprising a first gas supply connected to the plurality of inner gas inlets, the first gas supply being configured to provide a first gas onto the substrate.

7. The supercritical drying apparatus as claimed in claim 6, wherein:
   the lower housing has a lower gas inlet adjacent to the fluid outlet, and
   the first gas supply is configured to provide the first gas into the lower gas inlet.

8. The supercritical drying apparatus as claimed in claim 1, wherein:
   the supercritical drying apparatus further includes a second gas supply configured to provide a second gas into the plurality of outer gas inlets.

9. A supercritical drying apparatus, comprising:
   a lower housing having a fluid outlet;
   an upper housing on the lower housing and having a fluid inlet, a plurality of inner gas inlets on opposite sides of the fluid inlet a plurality of outer gas inlets on opposite sides of the inner gas inlets, and a groove under the plurality of outer gas inlets;
   a chuck on a bottom surface of the upper housing, the chuck being configured to receive a substrate;
   a fluid supply configured to provide a supercritical fluid onto the substrate through the fluid inlet;
   a light source in the upper housing between the chuck and the fluid inlet when viewed in a plan view, the light source being configured to decompose dry particles on the substrate by heating the substrate; and
   a window plate disposed under the light source,
   wherein:
   the light source includes an outer light source and an inner light source in the outer light source,
   the inner light source is disposed between the fluid inlet and the plurality of inner gas inlets,
   the plurality of inner gas inlets are disposed between an outer sidewall of the inner light source and an inner sidewall of the outer light source,
   the outer light source is disposed between the plurality of inner gas inlets and the plurality of outer gas inlets,
   the chuck includes a pair of fixing plates connected to the window plate and a plurality of holders connected to the pair of fixing plates, wherein the pair of fixing plates face each other, and
   the groove has a ring shape, which surrounds the window plate, and an inner diameter of the groove is equal to a distance between outer sidewalls of the pair of fixing plates.

10. The supercritical drying apparatus as claimed in claim 9, further comprising a first gas supply connected to the plurality of inner gas inlets, the first gas supply being configured to supply a first gas onto the substrate.

11. The supercritical drying apparatus as claimed in claim 9, wherein the window plate covers the outer light source and the inner light source.

12. The supercritical drying apparatus as claimed in claim 9, wherein:
   the supercritical drying apparatus further includes a second gas supply configured to provide a second gas around the substrate through the plurality of outer gas inlets and the groove.

13. A method of drying a substrate, the method comprising:
   providing the supercritical drying apparatus as claimed in claim 1,
   providing a substrate into the supercritical drying apparatus;

providing a supercritical fluid into the supercritical drying apparatus, thereby drying the substrate;

providing radiant heat to the substrate to instantaneously heat the substrate; and separating the upper housing from the lower housing.

14. The method as claimed in claim 13, further comprising providing a first gas onto the substrate.

15. The method as claimed in claim 14, further comprising providing a second gas around the substrate.

16. The method as claimed in claim 15, wherein:
the first gas includes nitrogen gas, and
the second gas includes nitrogen gas.

17. The method as claimed in claim 13, wherein providing the supercritical fluid includes:
increasing a pressure of the supercritical fluid in the supercritical drying apparatus;
saturating the pressure of the supercritical fluid; and
reducing the pressure of the supercritical fluid.

\* \* \* \* \*